United States Patent [19]
Bjerede et al.

[11] Patent Number: 5,722,040
[45] Date of Patent: Feb. 24, 1998

[54] METHOD AND APPARATUS OF FREQUENCY GENERATION FOR USE WITH DIGITAL CORDLESS TELEPHONES

[75] Inventors: Bjorn E. Bjerede, La Jolla; Joseph T. Lipowski, San Diego; James E. Petranovich; F. Matthew Rhodes, both of Encinitas, all of Calif.

[73] Assignee: Pacific Communication Sciences, Inc., San Diego, Calif.

[21] Appl. No.: 13,625

[22] Filed: Feb. 4, 1993

[51] Int. Cl.$^6$ .................................................. H04B 1/40
[52] U.S. Cl. ....................... 455/76; 455/83; 455/84; 379/61; 375/222; 370/29
[58] Field of Search .......................... 455/76, 77, 79, 455/82, 83, 84, 85–87; 379/61; 307/591; 375/219, 222; 370/29

[56] References Cited

U.S. PATENT DOCUMENTS

| | | | |
|---|---|---|---|
| 4,520,474 | 5/1985 | Vilmur | 455/87 |
| 4,785,450 | 11/1988 | Bolgiano et al. | 379/59 |
| 5,023,932 | 6/1991 | Wakana | 379/61 |
| 5,148,471 | 9/1992 | Metroka et al. | 370/61 |
| 5,258,981 | 11/1993 | Davey et al. | 370/29 |
| 5,267,233 | 11/1993 | Bauerschmidt | 370/29 |
| 5,303,191 | 4/1994 | Eagan et al | 307/591 |
| 5,309,429 | 5/1994 | Fukuda | 455/86 |

*Primary Examiner*—Reinhard J. Eisenzopf
*Assistant Examiner*—Doris To
*Attorney, Agent, or Firm*—Fish & Richardson, P.C.

[57] ABSTRACT

Methods and apparatus for digital cordless telephone systems are preferably implemented in an integrated circuit chip set having one or more chips, adapted to receive a voice signal, for converting the voice signal into a digital signal of a desired form, for converting the digital signal into an analog signal and for modifying the frequency of the analog signal, for up converting during transmission the frequency of the analog signal from an intermediate frequency to a desired radio frequency and for down converting during reception from a selected radio frequency to the intermediate frequency and for amplifying the radio frequency signal during transmission and for switching the antenna between the transmit and receive paths. It is preferred for the chip set to include a base chip, an intermediate frequency chip, a radio frequency chip and an amplifier chip. It is preferred to also provide a synthesizer integrated circuit chip for generating carrier select signals to be used by the radio frequency chip in selecting desired carrier frequencies. The invention also includes a frequency translation scheme to be utilized in conjunction with the various chips. Utilization of this scheme serves to reduce spurious noise as well as to suppress transmit signals during receive operations. The invention also includes various sensors for adjusting the level of the signal to be transmitted and for adjusting the level of the signal received at the antenna.

49 Claims, 7 Drawing Sheets

METHOD AND APPARATUS OF FREQUENCY GENERATION FOR USE WITH DIGITAL CORDLESS TELEPHONES

CROSS-REFERENCE TO RELATED APPLICATION

This application is related to application Ser. No. 999,310, filed Dec. 31, 1992, now U.S. Pat. No. 5,376,894, which is assigned to the same assignee and is incorporated herein by reference.

FIELD OF THE INVENTION

The present invention relates generally to cordless telephone systems and more particularly to frequencies generated and utilized in digital cordless telephone systems.

BACKGROUND OF THE INVENTION

Presently, the design of cordless telephone systems is based primarily upon techniques for generating a speech representative signal using analog techniques and for transmitting the analog formed signal in accordance with known radio transmission techniques. It will be appreciated that analog techniques for generating speech representative signals are susceptible to interference and noise. Next generation cordless telephones will undoubtedly incorporate digital techniques for generating the speech representative signal, which digital signal would then be converted into analog form for transmission. Such next generation phones have been referred to as digital cordless telephones (DCT) or Personal Handi-Phones (PHP).

Since digital techniques effectively reduce speech representative signals to a series of numbers, the generated and reproduced speech signals would be more reliable, i.e., have less interference and noise, than the analog based speech signals produced in presently available cordless telephone systems. Indeed, digital techniques for generating speech or voice representative signals are now known for use in relation to cord-based telephone systems.

As used herein, cordless telephone or digital cordless telephone (DCT) refers to those systems intended for home, public or office use. Such systems typically include a battery powered portable station (handset) and a base station, with the base station being connected into the public telecommunication network. Although the invention may also find use in cellular or mobile phone systems, it is not so described herein.

Transmission standards or specifications have already been developed in both Japan and Europe for use in designing DCT systems. Each of the transmission standards are based on the use of a time division duplex (TDD) format, employing time division duplex for two-way communication. For purposes of illustration herein, the Japanese standards will be emphasized. However, it is noted that the invention will have utility with any transmission standard and is therefore not limited to use solely with the Japanese standard.

The Japanese DCT transmission standard specifies the use of a plurality of individual carrier signals having a frequency separation of 300 kHz within an overall system bandwidth of about 23 MHz between approximately 1,895 MHz to 1,918 MHz. Each carrier signal should support four channels in a TDMA format employing time division duplex for two-way communication. In particular, for each frame of time (5 ms) there are four transmit time slots (one for each channel) and four receive time slots (one for each channel). Each slot is approximately 625 µs long with a guard time of approximately 30 µs provided within each slot.

Under the Japanese standard, speech representative signals are to be generated using a known digital technique, namely, the adaptive pulse code modulation (ADPCM) technique. The ADPCM signal is thereafter used to generate a digital modulated signal. The modulation scheme specified in the Japanese standard is the differential $\pi/4$-QPSK ($\pi/4$-quadrature phase shift keying) scheme with square root raised cosine filtering. It will be appreciated that such a scheme permits the transmission of digital data (1s and 0s) using a minimum number of bits. Digital data generated by this scheme is to be transmitted at a rate of 384 kHz which, in view of the modulation scheme, corresponds to a symbol transmission rate of 192 kHz. For a more detailed explanation of the differential $\pi/4$-QPSK modulation scheme, reference is made to co-pending application Ser. No. 999,310 filed Dec. 31, 1992, now U.S. Pat. No. 5,376,894. By contrast, the European DCT system specifies a series of carriers spaced 1.728 MHz apart within an overall bandwidth of approximately 17.28 MHz. Each carrier is to support twelve full duplex channels, i.e., 12 slots for transmission and 12 slots for reception.

Unfortunately, the specification of particular transmission standards is only the beginning. Having established the particular parameters in which digital cordless telephone operation can occur, several technical problems arise in relation to the design and selection of components to be used for generation, transmission and reception of speech representative signals. These problems will require resolution in order to achieve the development of digital telephone equipment capable of operation within the parameters of such standards.

One such problem results from the use of the TDMA-duplex scheme. At first glance, such an approach has the appearance of being low cost, however, implementation could in fact be high in a fully deployed system. This problem can be appreciated in relation to the Japanese standard. As indicated above, the time format for the Japanese standard specifies eight communication slots per frame wherein each slot will be 625 µs in duration with a guard time of approximately 30 µs included in each slot. The transmit and receive slots are to be grouped four and four, i.e., the first four slots are for transmission and the second four slots are for reception. In order to communicate in all slots, it must be possible to switch between receive and transmit functions, i.e., to switch between the fourth and fifth slots, in less than the 30 µs guard time. Although such a small switching time is significant in relation to the transmit and receive components of a DCT system, this switching time has an even greater significance with regard to the frequency generation components.

As indicated above, the differential $\pi/4$-QPSK scheme is specified to generate the modulated speech representative signal. Since such a signal is digital in form, it will be converted to analog form to generate a transmission signal. Most likely, it will be necessary to modify the frequency of the transmission signal upward in order to transmit this signal at the proper carrier frequency. A reference signal would most likely be combined in a mixer device with the transmission signal in order to modify upward the frequency of the transmission signal to the desired carrier frequency. It will be appreciated that the reference signal must have a sufficiently high frequency for the mixer to produce the desired carrier frequency, since the resulting carrier frequency will be equal to the frequency sum and/or difference. Additional signal reception will most likely include some form of heterodyne reception. In that situation, the carrier frequency of the received signal would be modified downward by mixing the received signal with a signal having a known frequency producing a received signal having a frequency equal to the frequency difference.

If a frequency synthesizer is utilized to generate signals having the necessary frequencies for use in such transmission and reception schemes, the ability of the synthesizer to switch from the generation of one frequency to another must be on the order of 30 µs or better. One way to resolve the synthesizer switching time problem would be to transmit and receive at the same intermediate frequency. In such a situation it would only be necessary to switch the synthesizer frequency if it were desired to transmit and receive on a different channel.

However, receiving and transmitting at the same intermediate frequency would result in a still further problem, namely, local transmissions interfering with reception. A conventional approach to generating a transmit carrier is through the use of a quadrature mixer. In such a case, the reference signal will generate output components at the carrier frequency because of the limited isolation achievable by the switching devices typically used with such mixers. In order to overcome such a problem, the transmit power will have to be suppressed to a level much lower than the receive sensitivity of the DCT during a receive mode. Such action would correspond to suppression of the transmit power on the order of 130 dB. Such suppression may not be practical if isolation between transmit and receive components is via conventional signal switching techniques.

The isolation problem is made even worse when the desire to reduce the physical sizes of both the portable station and the base station and the weight of the portable stations are taken into consideration. Since the portable stations are primarily handheld sets, size reduction is particularly desirable. One solution to the sizing problem is the implementation of a DCT in one or more integrated circuit (IC) chips. In such an implementation, isolation between transmission and reception becomes even more critical because of the extremely short distances that would result between transmit and receive components.

Moreover, an implementation in IC chips presents a still further problem, namely the spurious interference resulting from the various sinusoidal signals which would be present in such chips in relation to the various mixing operations. Such spurious interference becomes more significant due to the extremely short distances associated with ICs.

Accordingly, a need exists for a digital cordless telephone system that meets the requirements of DCT standards, that can quickly switch between the transmit and receive functions, that can utilize a non-switched frequency synthesizer for receive and transmit functions, that provides significant isolation between transmit and receive components and that is capable of being implemented in an IC form.

SUMMARY OF THE INVENTION

The previously described problems are overcome and the objects and advantages of the invention are achieved in an apparatus and method for digital cordless telephone systems. In accordance with the invention, such systems include an integrated circuit chip set having a base integrated circuit chip, adapted to receive a voice signal, for converting the voice signal into a digital signal of a desired form, an intermediate frequency integrated circuit chip for converting the digital signal into an analog signal and for modifying the frequency of the analog signal. During transmission, the frequency of the analog signal is up converted to an intermediate frequency and during reception a transmitted signal is down converted from an intermediate frequency to a lower frequency. A radio frequency integrated circuit chip for up converting during transmission the frequency of the analog signal from the intermediate frequency to a desired radio frequency and for down converting during reception from a selected radio frequency to the intermediate frequency. An amplifier integrated circuit chip, connected between the radio frequency chip and an antenna. The amplifier chip defines transmission and receive paths, for amplifying the radio frequency signal during transmission and for switching the antenna between the transmit and receive paths. The invention also envisions the integrated circuit chips being provided as a set.

The system can also include a frequency synthesizer integrated circuit chip, for connection to the radio frequency chip, for generating a reference signal for mixing with the radio frequency signal and the intermediate frequency signal in the radio frequency chip.

It is preferred for the base chip to include a digital signal generator for generating a pulse code modulated signal representative of the voice signal. In such an embodiment, the base chip includes a modulator for generating a phase shift keyed modulated signal representative of the pulse code modulated signal.

Considering each chip individually, the base band integrated circuit chip preferably includes a processor for adaptively converting a voice signal into a digital signal, a modem for transmitting the digital signal in response to a control signal and a control processor for generating the control signal so that the modem transmits the digital signal only during desired time periods. It is preferred for the modulator to include a signal generator for generating a digital signal representative of the voice signal at a given repetition rate and an interpolator for generating a series of digital samples, in response to the digital signal, wherein the samples are generated at a given symbol rate. It is preferred for the symbol rate to be high enough such that if the digital samples are not converted into an analog signal, any transmit signals occurring in the DCT system will be filtered can be filtered out.

The intermediate frequency integrated circuit chip preferably includes a digital to analog converter for converting the digital signal to an analog signal for transmission, an analog to digital converter for converting various analog signals for further processing by the base chip, a data bus connected between the converters and adapted for connection to the base chip, a mixer connected to the digital to analog converter and a detector for generating a digital signal representative of the received signal. The mixer serves to either increase the frequency of the analog signal or decrease the frequency of received signals. The mixer is connected to operate on either the transmit signal or the received signal. A local oscillator is also included for providing a reference signal having a known frequency to the mixer. In such a chip the data bus, the mixer and the local oscillator are shared for both receive and transmit operations. It is especially preferred to include a second mixer for further modifying the frequency of the received signal after the signal is processed in said first mixer. It is also preferred for one or more of the mixers to be of the single sideband-image rejection type. The use of such mixers eases the limitations of the filters and power dissipated during output amplification.

It is also preferable for the detector of the intermediate frequency chip to include a limiter and an interpolator for generating a digital receive signal representative of the analog received signal.

The radio frequency integrated circuit chip includes a first switch, adapted to be connected to receive the analog signal. This first switch is operable in response to a control signal provided by the base chip. A second switch is included also operable in response to the control signal. First and second mixers are connected between the first and second switches, thereby defining transmit and receive paths.

The amplifier and switch integrated circuit chip includes first and second switches operable in response to the control signal provided by the base chip and interconnected to define a receive path and an amplifier, connected between the first and second switches, thereby defining a transmission path. The antenna is connected to either the transmission path or the receive path in response to the control signal.

The invention also includes method and apparatus for implementing a desired frequency translation scheme. In this regard the invention includes three stages. The first stage, adapted to receive a voice signal, is for converting the voice signal to a digital signal having a repetition rate, for generating a series of digital samples representative of a modulated carrier signal and adapted to receive a digital signal representative of the transmitted signal.

The second stage, connected to said first stage, is for receiving the series of digital samples, for converting the digital samples into an analog transmission signal having an initial frequency and for modifying the initial frequency in relation to a first reference signal having a first frequency. The second stage is also adapted to receive remotely transmitted signals having an intermediate frequency and for modifying the intermediate frequency of the transmitted signal in relation to a second reference signal having a second frequency, the first and second reference signals being locally generated.

The third stage, connected to the second stage and adapted to receive the remotely transmitted signals from the antenna, is for further modifying the frequency of the transmission signal in relation to a first carrier signal having a third frequency and adapted to receive the remotely transmitted signals having a radio frequency from the antenna and for modifying the frequency of the remotely transmitted signal in relation to a second carrier signal having a fourth frequency. It is preferred for the sample rate, first and second frequencies to be integer multiples of a master frequency. It is especially preferred for the master frequency to be a multiple of the symbol rate and the channel spacing, such as 9.6 MHz.

It is preferred for the modulated carrier signal to have a modulated carrier frequency. In that situation the modulated carrier frequency and the second frequency are equal. Wherein the repetition rate is controlled by the first stage it is preferred for the ratio of the repetition rate to the master frequency to be a fraction of two integers, i.e., an integer ratio. It is especially preferred for the ratio to equal 3/25. It is also preferred for the third and fourth frequencies to be equal.

In one embodiment the first stage includes a modulator for generating the digital signal representative of the voice signal at the repetition rate and for generating, in response to the digital signal a series of digital samples of a carrier signal having a carrier frequency. A modem is connected to the modulator for transmitting the digital samples in response to a control signal, wherein the digital samples are only provided during desired transmission periods. A controller is connected to the modem for generating the control signal. In such an embodiment, it is preferred to include a first band pass filter between the second and third stage, wherein the first bandpass filter defines a first band of frequencies. In such an embodiment the first frequency will fall outside the band, such that if the analog transmission signal having the initial frequency is not present in the second stage, the first reference signal will not pass through the first bandpass filter. The first bandpass filter is also operative to reject the undesired image created by mixing the analog transmission signal with the first reference signal.

It is also preferred for a second bandpass filter to be connected between the third stage and the antenna, the second bandpass filter defining a second band of frequencies. In such an embodiment, the third frequency falls outside the band, such that if the analog transmission signal having the initial frequency is not present in the second stage, a signal at the third frequency will not pass through the second bandpass filter. The second bandpass filter is also operative to reject the undesired image created by mixing the analog transmission signal with the third reference signal.

It is also preferred for the synthesizer to generate first and second local oscillator signals having frequencies that are integer multiples of a reference frequency. It is especially preferred for the reference frequency to be selected in terms of or in relation to the channel spacing.

It is still further preferred for the invention to include a gain controller for controlling the level of the transmission signal. To this end, the controller controls the level of the transmission signal either by modifying the digital values of the digital signal generated in relation to the voice signal or by modifying the conversion of the digital signal to an analog signal so that an analog signal having the desired level results. In determining how much gain adjustment is desired, preferred forms of the invention (implemented in integrated circuits) include a temperature sensor for sensing the temperature of the integrated circuit and for providing a temperature indication signal. The level of the transmission signal is controlled in response to the temperature indication signal. In one form of the invention, the controller can include a table of empirically determined values for adjusting the gain in relation to specific temperatures sensed by the temperature sensor. It is preferred, however, for adjustments in the level of the transmission signal to be determined in relation to a formula stored in the controller. The formula is determined by empirically determining desired adjustments to the gain relative to temperature and developing equation for calculating gain versus temperature via any known curve fitting technique.

In another embodiment of the invention, a battery is used to power at least one of the integrated circuits. In this embodiment a voltage sensor is provided for sensing the voltage of the battery and for providing a voltage indication signal. The level of the transmission signal is controlled by the controller in response to the voltage indication signal. It is especially preferred for the voltage sensor to be implemented in the second stage. In this embodiment an equation is used for determining adjustments to the gain in relation to specific voltages sensed by the voltage sensor. Similar to temperature related adjustments, adjustments in response to changes in voltage are determined empirically and an equation is developed for calculating gain versus voltage via any known curve fitting technique. It is most preferred to use both the temperature sensor and voltage sensor simultaneously.

It is also preferred for the third stage to include a gain controller for controlling the level of said received signal. In one embodiment, the gain controller includes a network, connected in the receive path, for modifying the level of said received signal. It is preferred for the level network to include an amplifier, a neutral path and an attenuator. The received signal is passed through one of these components in response to a control signal.

In one embodiment, a level detector is implemented in the amplifier stage for detecting the level of the received signal from the antenna and for generating a level indicating signal. The level controller generates the control signal in response to the level indicating signal. In another embodiment, a level detector is positioned in the radio frequency portion of the system. In a still further embodiment, the level detector is located in the intermediate frequency portion of the system.

It is finally preferred for a portion of the level controller to be implemented in the base or first stage. In such an embodiment, the portion implemented in the base stage is connected to receive the level indicating signal and connected to the level network. It is the portion implemented in the base stage which generates the control signal.

BRIEF DESCRIPTION OF THE DRAWINGS

The present invention will be better understood, and its numerous objects and advantages will become apparent by reference to the following detailed description of the invention when taken in conjunction with the following drawings, in which.

DETAILED DESCRIPTION

Figure 1:
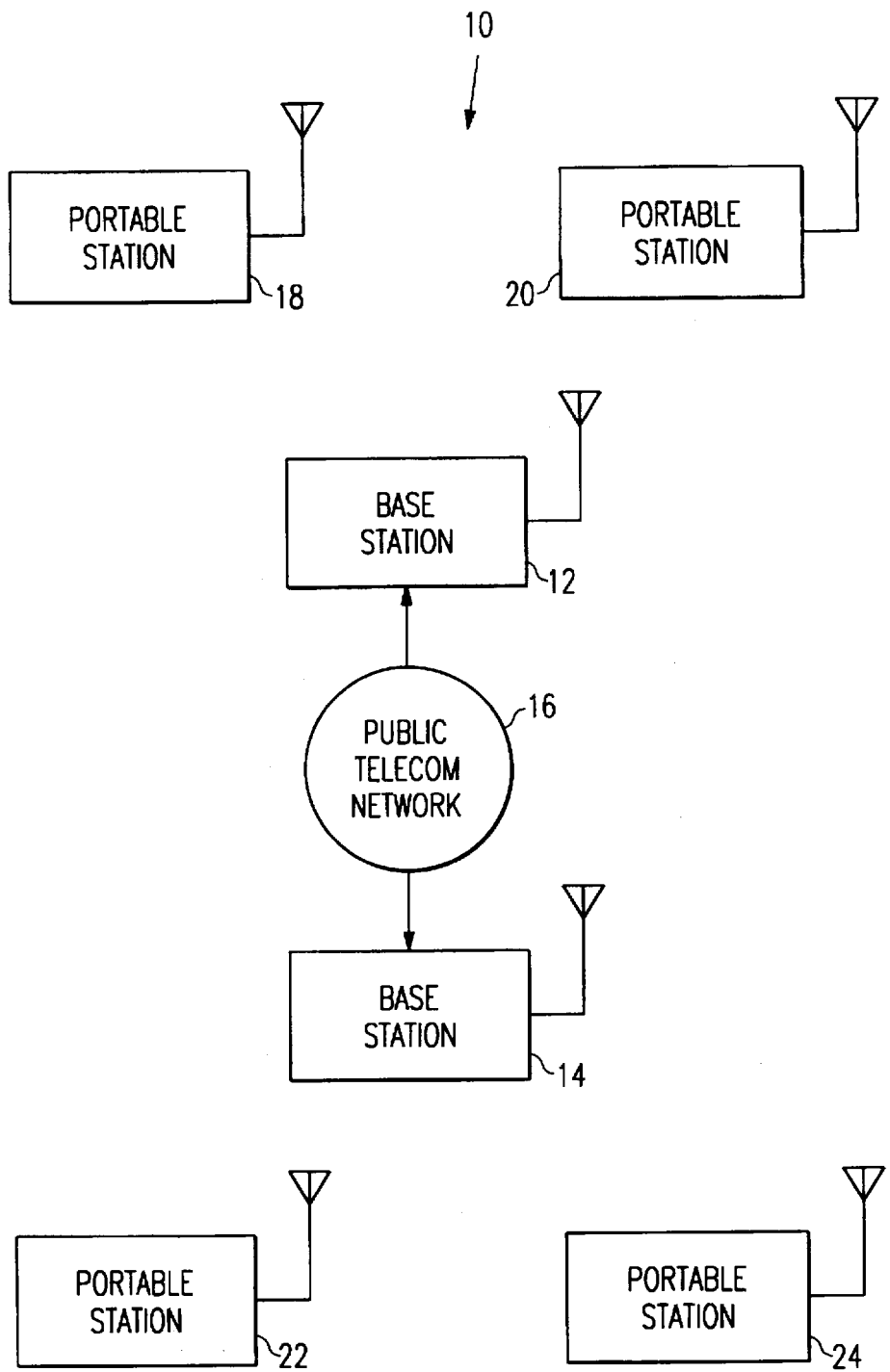
FIG. 1 is a block diagram of a digital cordless telephone system constructed in accordance with the present invention.

A DCT system constructed in accordance with the present invention is shown in FIG. 1 and generally designated 10. DCT system 10 is shown to include two base stations 12 and 14, each of which are adapted for connection to public telecommunications network 16. Portable stations 18 and 20, associated with base station 12, and portable stations 22 and 24, associated with base station 14, provide two-way cordless communication, i.e. a person using portable station 18 can have a conversation with a person using portable station 24. It is noted that the portable stations 18 through 24 are preferably in the form of a battery-operated handset.

It will be appreciated that base station 12 and portable stations or handsets 18 and 20 may be physically located several miles from base station 14 and portable stations 22 and 24. The distance between base stations is only limited by the capabilities of network 16. Although the invention may be useful in portable stations capable of transmitting signals over several miles, it is described herein in terms of units adapted for transmitting signals within about 100 feet between base station and portable station. Additionally, although the present invention may be useful in portable stations which are capable of communicating directly with other portable stations, the invention is described herein in terms of the portable stations engaging in two-way communication via their associated base stations.

The invention will be described herein in terms of its use in the Japanese Personal Handi-Phone (PHP) system specification described previously. It will be recalled that the Japanese standard specifies the use of a plurality of individual carrier signals having a frequency separation of at least 300 kHz within an overall system bandwidth of about 23 MHz between approximately 1,895 MHz to 1,918 MHz. Each carrier signal should support four channels in a TDD format employing time division duplex for two-way communication.

Figure 2:
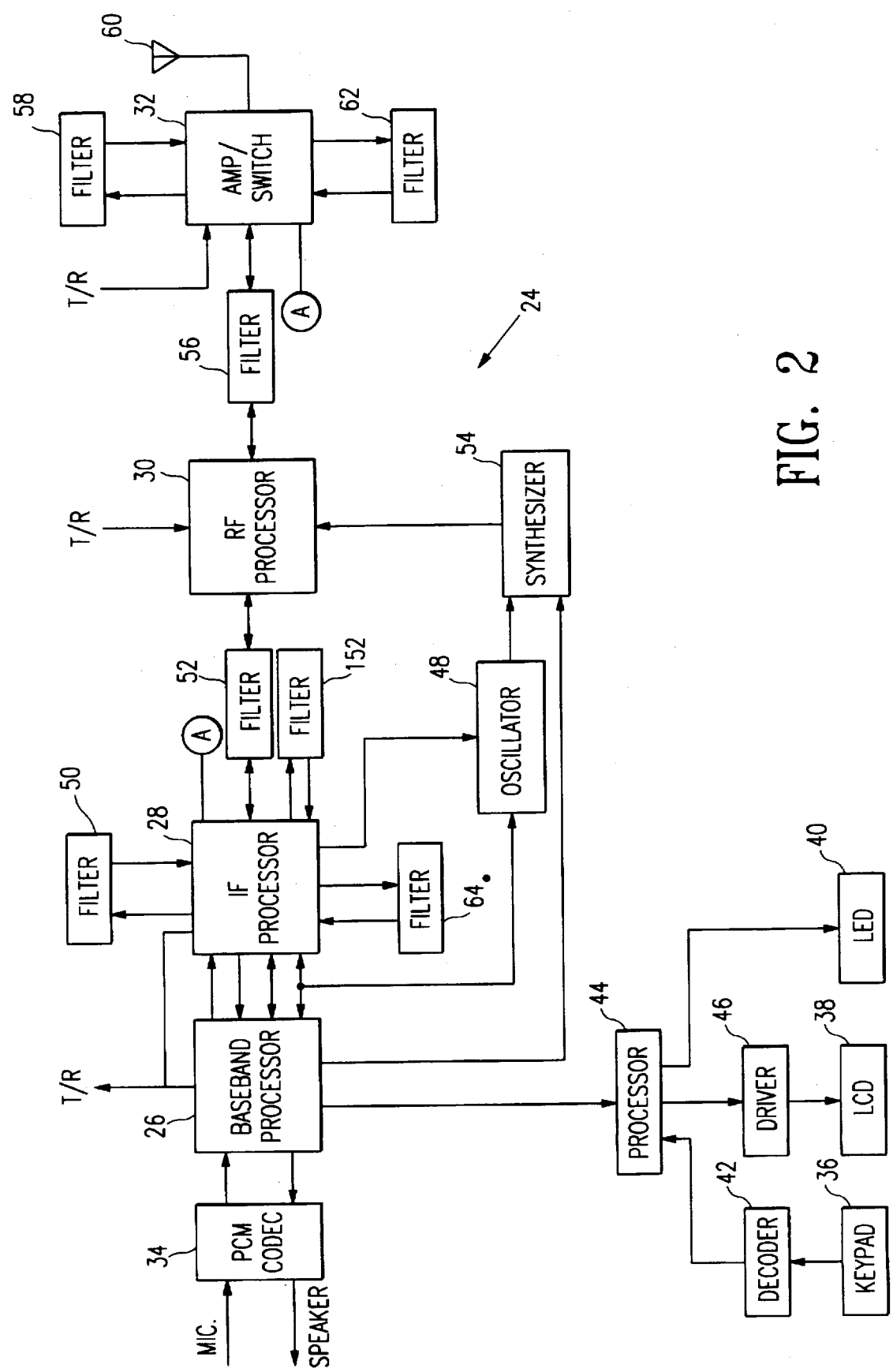
FIG. 2 is block diagram of the core components of a portable station depicted in FIG. 1.

It is noted that the internal structure of handsets 18 through 24 are identical, i.e. only the frequencies or time slots at which these handsets transmit and receive will be different. Consequently, only the internal structure of portable station 24 will be described. Such internal structure is generally depicted in FIG. 2.

The core of portable station 24 is an integrated circuit chip set including chips or processors 26, 28, 30 and 32. Before giving a detailed description of the structure of each chip, consider generally the operation of processors 26 through 32 during a transmit and receive operation. During transmission, base band processor 26 receives a voice signal and operates to convert the voice signal into a digital signal having a desired form, i.e., a differential $\pi/4$-QPSK signal. The digital signal is provided to intermediate frequency (IF) processor 28 which converts the digital signal into an analog signal and modifies the frequency of the analog signal upward to an intermediate frequency. The intermediate frequency signal is provided to radio frequency (RF) processor 30. RF processor 30 further modifies the frequency of the carrier signal upward to the radio frequency desired for transmission. The radio frequency signal is provided to amp/switch chip 32. During transmission, chip 32 amplifies the radio frequency signal and provides that amplified signal to an antenna for transmission to base station 14.

During reception, a signal received at the antenna is provided to IC 32 which passes the received signal to RF processor 30. RF processor 30 down converts or heterodynes the receive signal to an intermediate frequency signal, preferably the same intermediate frequency used during transmission. The intermediate frequency signal is provided to IF processor 28. IF processor 28 further down converts the frequency of the intermediate frequency signal, preferably a two step or dual down conversion, and generates a digital signal representative of the down converted received signal. The digital signal generated by IF processor 28 is provided to base band processor 26 for conversion into a voice signal.

Consider now a transmit operation of portable station 24 in greater detail. A microphone (not shown) provides an analog voice signal to pulse code modulation (PCM) codec 34. Codec 34 converts the analog voice signal into a pulse code modulated signal. Codec 34 can be any known device for converting analog voice signals into PCM signals. The PCM signal is provided to base band processor 26. It is noted that various peripheral devices are utilized in order to enable the transmit operation. In particular, keypad 36, liquid crystal display (LCD) 38 and light emitting diodes (LED) 40 are used to initiate transmission. Keypad 36 is operative through decoder 42 to provide appropriate dialing or keying signals to processor 44. Processor 44 in turn operates LCD 38 through driver 46 and is shown to enable LED 40 directly. Processor 44 in turn interacts directly with base band processor 26. A master oscillator 48 provides a master clock signal to processors 26 and 28. In the preferred embodiment, the frequency of the master clock signal is 19.2 MHz.

Processor 26 converts the PCM signal to a digital signal having a repetition rate of approximately 1.152 MHz, and interpolates the digital signal at an effective sampling rate of 9.6 MHz. The output of base band processor 26 is a series of digital samples representative of a modulated carrier signal having a frequency of 10.752 MHz. The samples are provided to IF processor 28. IF processor 28 converts the samples into an analog IF carrier in an internal digital-to-analog converter and thereafter filters the analog signal through bandpass filter 50. The filtered signal is provided back to IF processor 28 whereupon it is mixed with a local oscillator signal having a frequency of 259.2 MHz. The resulting signal, having a frequency of 248.448 MHz is thereafter passed through bandpass filter 52.

The output of band pass 52 is provided to RF processor 30 whereupon it is again mixed with a signal having a particular frequency. The object of this final mixing operation is to fix the frequency of the signal to be transmitted at the frequency of a desired channel. The reference signal which is utilized in this final mixing step is generated by synthesizer 54. It will be recalled that this reference frequency is a multiple of 300 kHz. It is noted that 300 kHz is chosen in relation to the channel spacing requirements. After this final mixing stage, a signal having a frequency in the range between 1,895 MHz to 1,918 MHz, is passed through bandpass filter 56 to amplifier/switch IC 32. During a transmit operation, IC 32 passes the signal received from filter 56 through an internal amplifier, the output of which is connected to filter 58. After passing through filter 58, the signal to be transmitted is provided back to chip 32 where it is connected to antenna 60 for transmission. It is noted that the switching of processors 28, 30 and 32 between transmit and receive operations is controlled by a T/R control signal generated by processor 26.

Consider now the structure of portable station 24 during a receive operation. Base band processor 26 generates an appropriate receive control signal which is applied to processors 28, 30 and 32. Upon receipt of this signal, IC 32 switches antenna 60 into a receive path, whereupon the signal from antenna 60 is passed through filter 62 back into IC 32 and provided to bandpass filter 56. Bandpass filter 56 is thus shared for both transmission and reception operations.

The output of band pass filter 56 is provided to RF processor 30. The receive signal is mixed in RF processor 30 with a signal generated by synthesizer 54 so that the desired carrier frequency is selected as a result of the heterodyne operation. The frequency of the signal generated by synthesizer 54 is such that the selected carrier is output from RF processor 30 at a frequency of approximately 248.448 MHz. The selected carrier output from RF processor 30 is passed through bandpass filter 52 and provided to IF processor 28. Bandpass filter 52 is thus also shared for both transmission and reception operations.

IF processor 28, through a mixing operation, reduces the frequency of the selected carrier to approximately 10.75 MHz. This signal is thereafter passed through bandpass filter 50. In an especially preferred embodiment, a separate bandpass filter is utilized for filtering the receive signal at this point (See FIG. 9). The selected carrier signal is thereafter subjected to a further mixing operation in order to reduce the carrier frequency to 1.15 MHz. The resulting 1.15 MHz signal is passed through bandpass filter 64 and back to IF processor 28.

At this point, IF processor 28, preferably via a limiting-interpolation operation, generates a digital signal representative of the selected carrier signal which is still in an analog form. The digital signal generated by IF processor 28 is provided to base band processor 26 whereupon it is demodulated and converted into a PCM signal and provided to codec 34. Codec 34 thereafter converts the PCM signal into an analog signal which is provided to a speaker (not shown) for reproduction.

Figure 3:
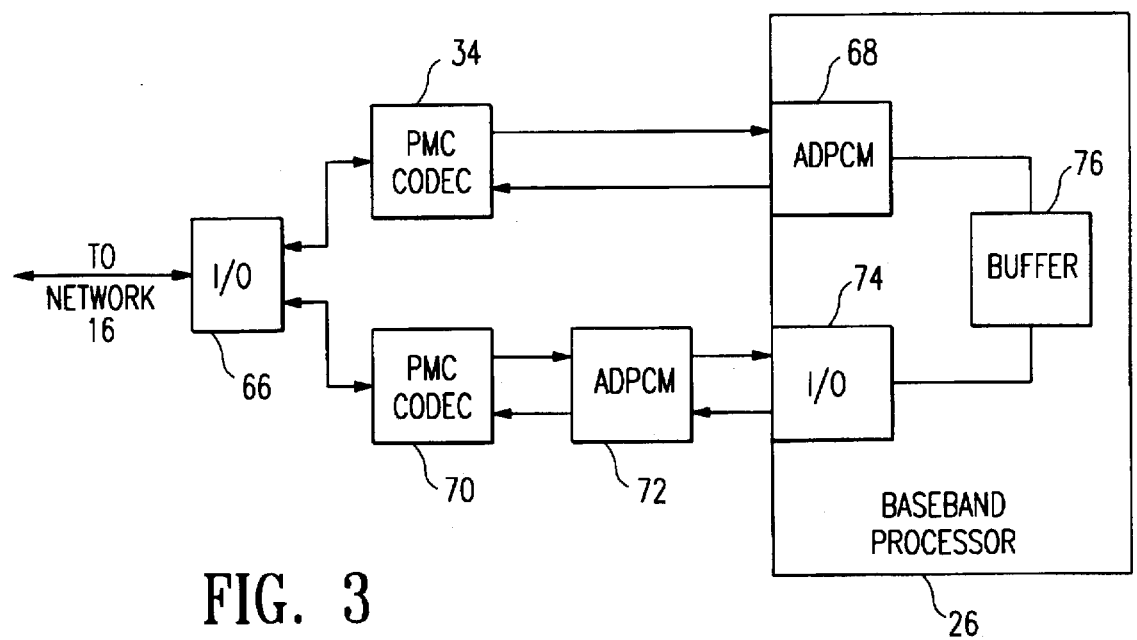
FIG. 3 is block diagram of a portion of the components of FIG. 2, modified so the components now form the core of a base station depicted in FIG. 1.

Referring now to FIG. 3, a description of the base station structure will be provided. It is noted initially that the structure of base station 14 is largely identical to that disclosed in FIG. 2, except for devices utilized in relation to base band processor 28. Consequently, only the differences are shown in FIG. 3.

In the embodiment described herein, base band processor 28 as used in base station 14, is not associated with any microphone or speaker. Clearly, such a modification could be made upon reviewing the disclosure of FIG. 2. Accordingly, the invention includes such a modification within its scope.

As shown in FIG. 3, base band processor 28 is again connected to a PCM codec 34. PCM codec 34 is in turn connected to an input/output device 66 which in turn is connected to public telecommunications network 16. It will be recalled that base band processor 28 in portable station 24 converted the signal provided by codec 34 into a series of digital samples. The first step in that conversion, for both portable station 24 and base station 14, is the processing of the PCM signal in an adaptive pulse code modulator (ADPCM) 68. The output of input/output device 66 is also connected to a PCM codec 70 which in turn is connected to a further ADPCM 72 operates in a manner virtually identical to ADPCM 68. The output of device 72 is provided to base band processor 26 through input/output portion 74. By providing two ADPCM units, base station 14 can handle two portable stations simultaneously. In other words, base station 14 can handle two separate incoming phone calls from network 16. The signals generated by ADPCM 68 and 72 are stored in buffer 76 for further processing by processor 26.

Since the differences between the portable stations and the base stations have been described in relation to FIG. 3, descriptions hereinafter will not be directed to any one type of station.

Figure 4:
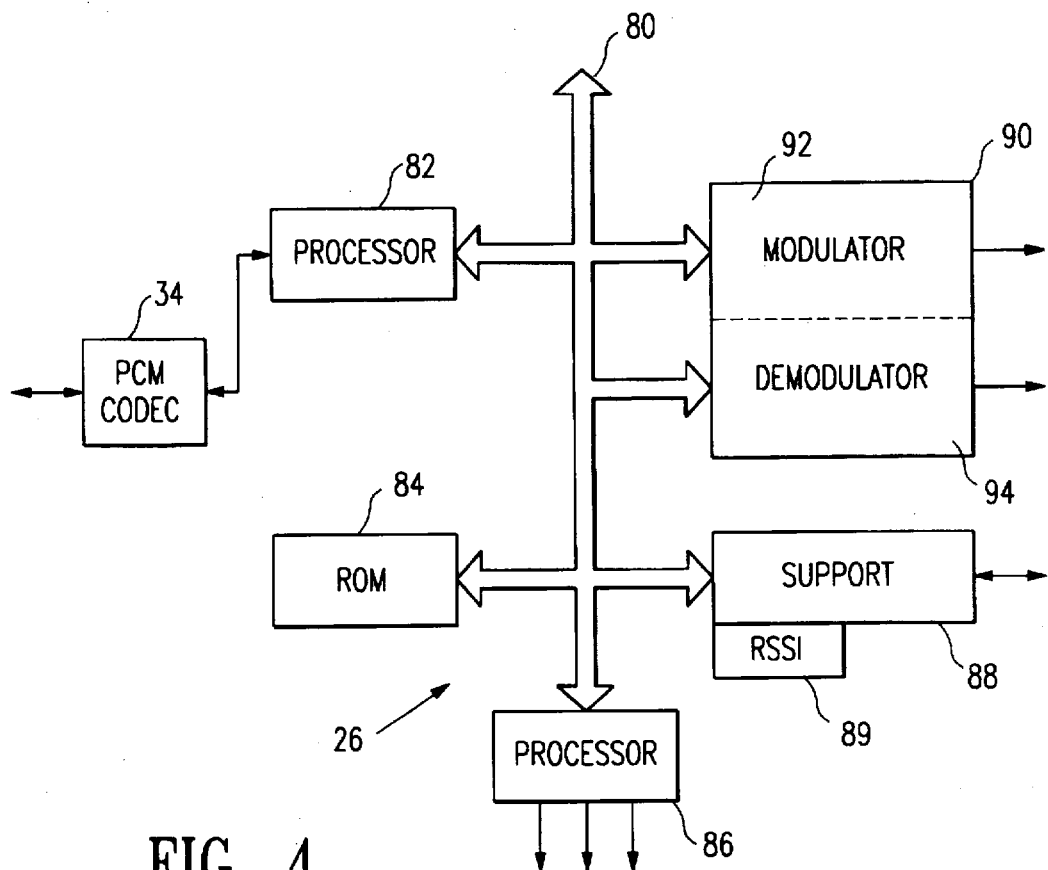
FIG. 4 is a generalized schematic showing the operation of the base band processor depicted in FIG. 2.

FIG. 4 generally discloses the internal operation of base band processor 26. Processor 26 is shown to include a central bus 80 which interconnects all of the various components of processor 26. Processor 82 is connected to bus 80 and is primarily responsible for adaptive pulse code modulation or adaptive pulse code demodulation, depending on whether a transmit or receive operation is being carried on. Programming for processor 26 is contained in read-only memory 84. An interface processor 86 is provided for interfacing processor 26 with the various peripheral devices, i.e., keypad 36, LCD 38 and LED 40.

A support device 88 is provided for the transmission and reception of various control signals such as the T/R signal. As will be described in relation to FIG. 8, support device 88 receives indications of temperature and voltage, which signals are operated upon by received signal strength indicator (RSSI) 89 in order to maintain an accurate estimate of signal strength.

A modem 90 is provided for the demodulation of received signals and for the modulation of signals to be transmitted. To this end, modem 90 includes a modulator 92 and a demodulator 94. Modem 90 controls both the provision of signals to IF processor 28 and the reception of signals from processor 28. It will be recalled that the digital signal received by demodulator 94 is representative of the analog signal received at antenna 60. For a more complete description of the operation of demodulator 94, reference is again made to co-pending application Ser. No. 999,310 filed Dec. 31, 1992, now U.S. Pat. No. 5,376,894.

Modulator 92 is connected to bus 80 and is responsible for producing a series of digital samples of a modulated carrier having a frequency of 10.752 MHz, referred to previously. The samples generated by modulator 92 are output from modem 90 to IF processor 28. Modem 90 is controlled in a fashion that digital samples generated by modulator 92 are only transmitted during prescribed time periods. During all other time periods, modem 90 prevents the transmission of digital samples to processor 28.

It will be recalled that one of the problems associated with a digital cordless telephone that transmitted and received information on the same carrier frequency, was the needed suppression of transmit power on the order of 130 dB. Such suppression is easily achieved by turning "off" modulator 92 of modem 90, i.e., by having modem 90 prevent the transmission of digital samples to processor 28. If modulator 92 of modem 90 is "OFF", any unwanted signal transmitted by processor 30, will have a sufficiently high frequency to not be passed by filter 52. Accordingly, the amount of suppression between the transmit and receive components is greater than 130 dB.

Figure 5:
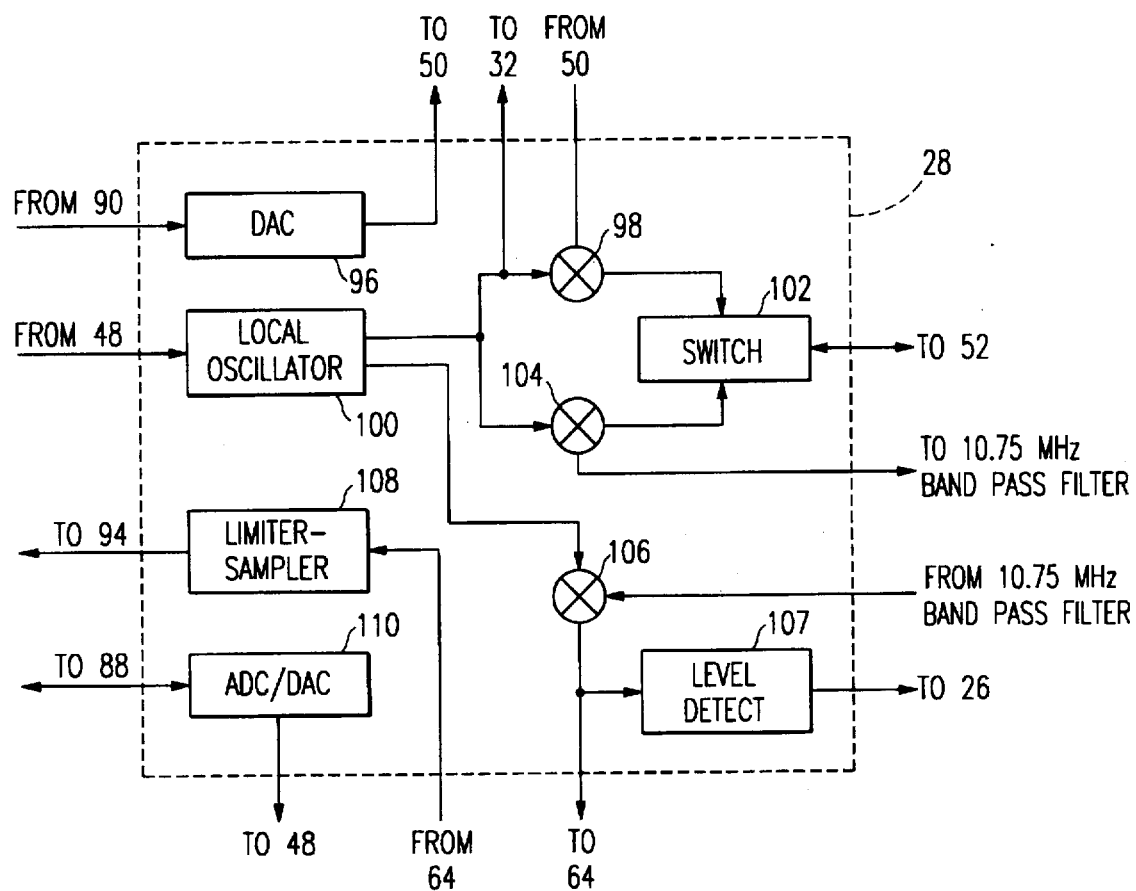
FIG. 5 is a generalized schematic diagram of the IF processor block depicted in FIG. 2.

Referring now to FIG. 5, the general construction of IF processor 28 will be described. The series of digital samples generated by modulator 92 is provided by modem 90 to digital to analog converter 96. Converter 96 converts the series of digital samples into an analog signal having a carrier frequency of approximately 10.752 MHz and modulated in accordance with information provided by modulator 92. During a transmit operation, this analog signal is passed through band pass filter 50 and provided to mixer 98. The 10.752 MHz is mixed with a signal generated by local oscillator 100. The frequency of the signal generated by oscillator 100 in the preferred embodiment is approximately 259.2 MHz. Since the transmit operation is occurring, the T/R signal generated by base band processor 26 is indicating transmit. Accordingly, switch 102 is switched to transmit the output of mixer 98 to band pass filter 52.

During a receive operation, the analog signal passing through filter 52 is provided to switch 102. The T/R signal will be indicating receive during a receive operation. Accordingly, switch 102 will provide the signal received from filter 52 to mixer 104. Mixer 104 mixes the receive signal with the same 259.2 MHz signal generated by oscillator 100 producing an analog signal having a frequency of approximately 10.75 MHz. As indicated previously, this 10.75 MHz signal can either be passed through band pass filter 50 or preferably through another band pass filter (not shown).

It is especially preferred for mixer 104 to be of the single sideband down-converter type which provides image rejection. By providing image rejection at mixer 104, filter 52 can be less precise. In other words, filter 52 will have reduced requirements for signal rejection. Consequently, filter 52 will be less costly and smaller to implement.

After filtering, the 10.75 MHz signal is provided to mixer 106, where it is mixed with a 9.6 MHz signal resulting in an output signal of approximately 1.15 MHz. The 1.15 MHz signal is provided to filter 64 and to level detector 107. Level detector 107 senses the level of the received signal and generates a signal level indication signal. This indication signal is provided to baseband processor 26. A more detailed description of the use of this indication signal is described in relation to FIG. 7. Generally, the level indication signal will be used to control either the amplification or attenuation of the received signal. No particular level detector is necessary, however, in the preferred embodiment, the indication signal is a digital signal, i.e. either logic high or logic low indicating that the received signal is above or below some desired level.

The output of filter 64 is provided to a limiter—sampler 108. The limiter—sampler generates a digital signal representative of the information contained in the 1.15 MHz signal received from filter 64. The digital signal generated by limiter—sampler 108 is provided to demodulator 94 in base band processor 26. An analog to digital and a digital to analog converter 110 is also provided in IC 28. As will be appreciated in relation to FIG. 8, converter 110 operates to provide environment information to base band processor 26 and also operates to generate control signals for oscillator 48.

It will be noted at this point, that the frequency of the signal generated by oscillator 48 is 19.2 MHz. As will be explained in relation to FIG. 9, all of the oscillator frequencies utilized in connection with processors 26, 28, 30 and 32 are integer multiples of 9.6 MHz, except for the frequencies of signals generated by synthesizer 54, which in the preferred embodiment are multiples of 300 kHz.

Figure 6:
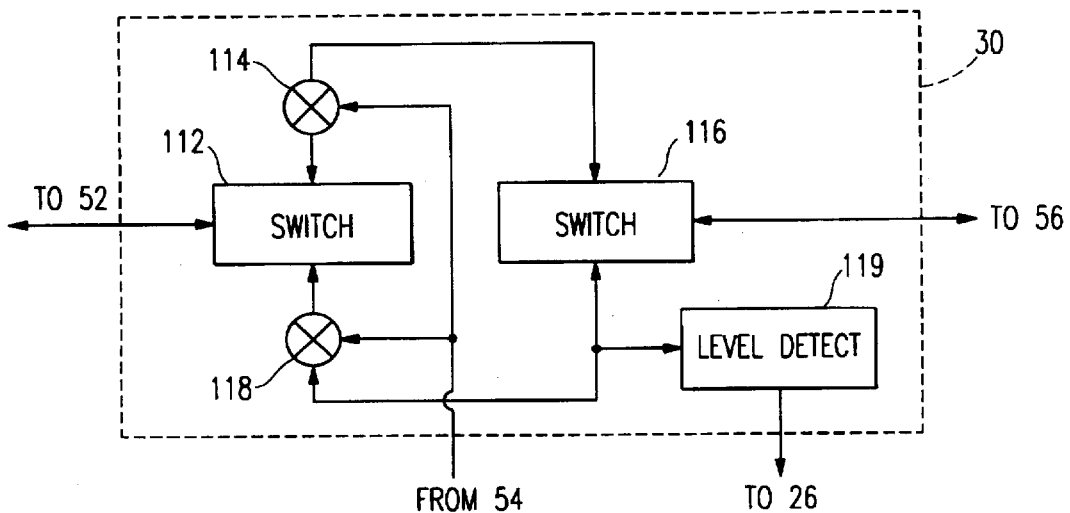
FIG. 6 is a generalized schematic diagram of the RF processor block depicted in FIG. 2.

Referring now to FIG. 6, the structure of RF processor 30 will be discussed in greater detail. During a transmit operation, analog signals passing through filter 52 are provided to switch 112. Switch 112 in turn provides the analog signal to mixer 114 where it is mixed with a signal generated by synthesizer 54. It will be recalled that the frequency of signals generated by synthesizer 54 are fixed so that the output of mixer 114 is at a desired carrier frequency in the range of frequencies between 1,895 MHz and 1,918 MHz. The output of mixer 114 is provided to switch 116 which during the transmit mode is switched to provide this analog signal to filter 56. The placement of mixer 114 between switch 112 and 116 defines a transmit path.

Similar to mixer 104, mixer 114 is preferably a single sideband up converter which provides image rejection. Such image rejection significantly reduces the power requirements of any signal amplification provided by IC 32. In other words, providing image rejection reduces by approximately four times the maximum signal level to be amplified. The power requirements of amplifier 122 (FIG. 7) are thus minimized by providing image rejection in mixer 114.

During a receive operation, the signal present on antenna 60 is provided through filter 56 to switch 116. Switch 116 in the receive mode is switched to provide the receive signal to mixer 118 where it is mixed with a signal generated by synthesizer 54. In the embodiment shown in FIG. 6, the signal provided by synthesizer 54 to mixer 118 is the same frequency as that provided to mixer 114. The heterodyne technique used in conjunction with mixer 118 serves to select one of the carrier signals received in antenna 60. The selected carrier signal is provided to switch 112 which in turn passes the selected signal to filter 52.

The signal provided to mixer 118 is also provided to level detector 119. Detector 119 senses the level of the received signal and generates a signal level indication signal. This indication signal is provided to baseband processor 26. A more detailed description of the use of this indication signal is described in relation to FIG. 7. Generally, the level indication signal, similar to that generated by detector 107, will be used to control either the amplification or attenuation of the received signal. No particular level detector is necessary, however, in the preferred embodiment, the indication signal is a digital signal, i.e. either logic high or logic low indicating that the received signal is above or below some desired level.

Figure 7:
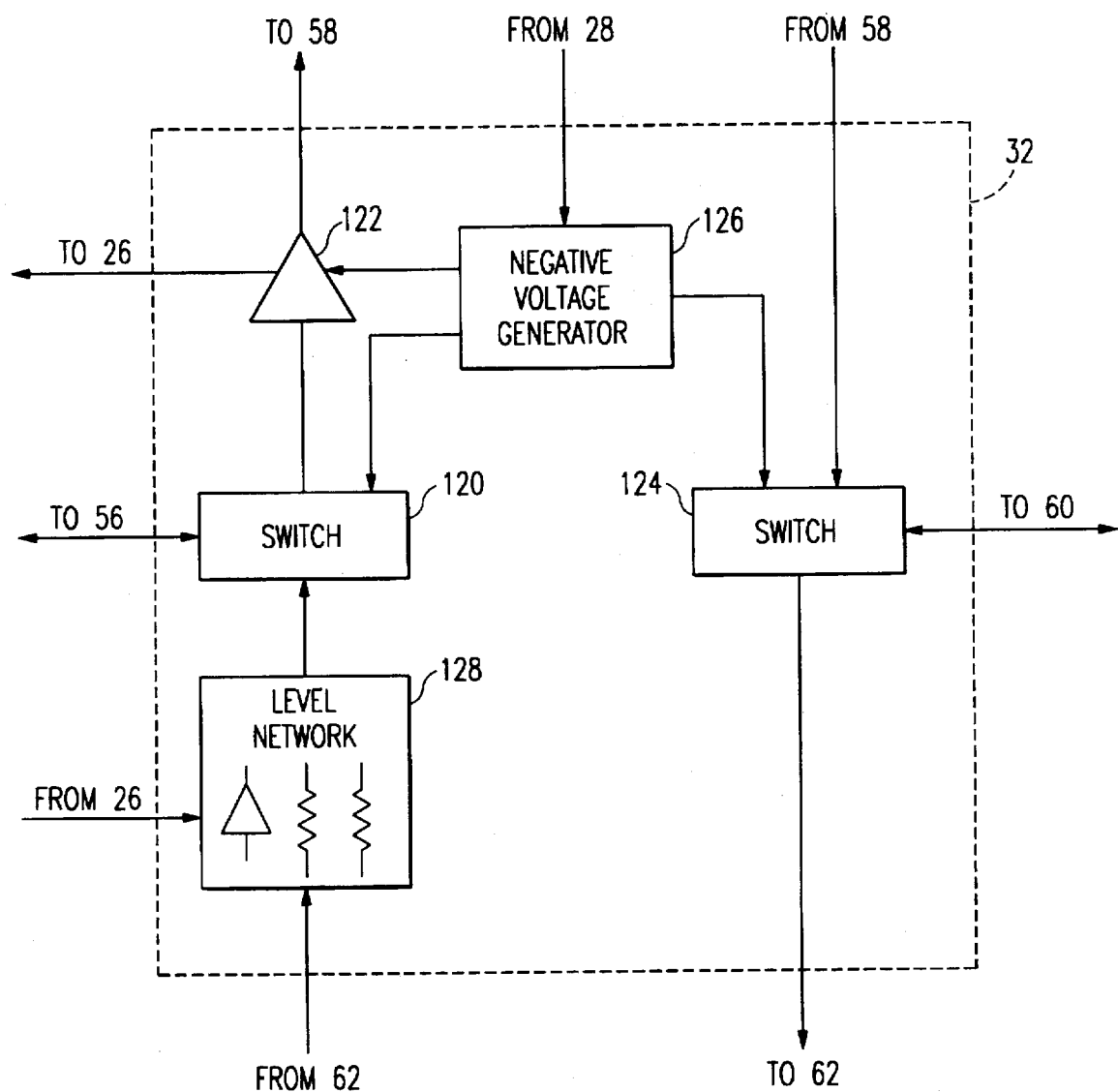
FIG. 7 is a generalized schematic diagram of the Amp/Switch block depicted in FIG. 2.

Referring now to FIG. 7, the operation of IC 32 will be described in greater detail. During a transmit operation, a signal is received from filter 56, the frequency of which is at the selected carrier frequency. The signal is provided to switch 120 which in turn provides the carrier signal to amplifier 122. Amplifier 122 provides the necessary power amplification such that when the carrier signal is provided to antenna 60, the signal will be received by a portable station or base station as the case may be. The output of amplifier 122 is provided to filter 58. The output of filter 58 is provided to switch 124. During a transmit mode, switch 124 is switched to provide the output of filter 58 to antenna 60.

IC 32 is also shown to include a negative voltage generator 126. Generator 126 converts the local oscillator signal provided by IC 28 into a negative voltage for use in switch 120, amplifier 122 and switch 124. It will be noted that elements 120–124 are preferably implemented utilizing a number of field effect transistors (FETs). The use of a negative voltage significantly enhances "switching" in such devices. Consequently, more precise operation of these elements can be achieved. Moreover, since the portable stations are battery powered, an independent source of negative voltage is unavailable.

During a receive mode, the signal received by antenna 60 is provided by switch 124 to filter 62. The output of filter 62 is provided by switch 120 to level network 128 where the received signal is modified. Preferably, the received signal is either amplified or attenuated. The output of network 128 is provided to filter 56.

In the embodiment depicted in FIG. 7, the received signal applied to network 128 is either amplified in a low noise amplifier which provides approximately 13 dB of gain, attenuated by approximately −4 dB in a first attenuator or attenuated by approximately −28 dB in a second attenuator. The received signal is processed by one of these components depending on the orientation of a switch mechanism. The switch is controlled by a control signal generated by processor 26. Processor 26 will switch between the various components until level indicator 107 indicates that the received signal is at some desired level or within some desired range. By providing this switching network, saturation caused by the portable station getting too close to the base station is avoided.

Figure 8:
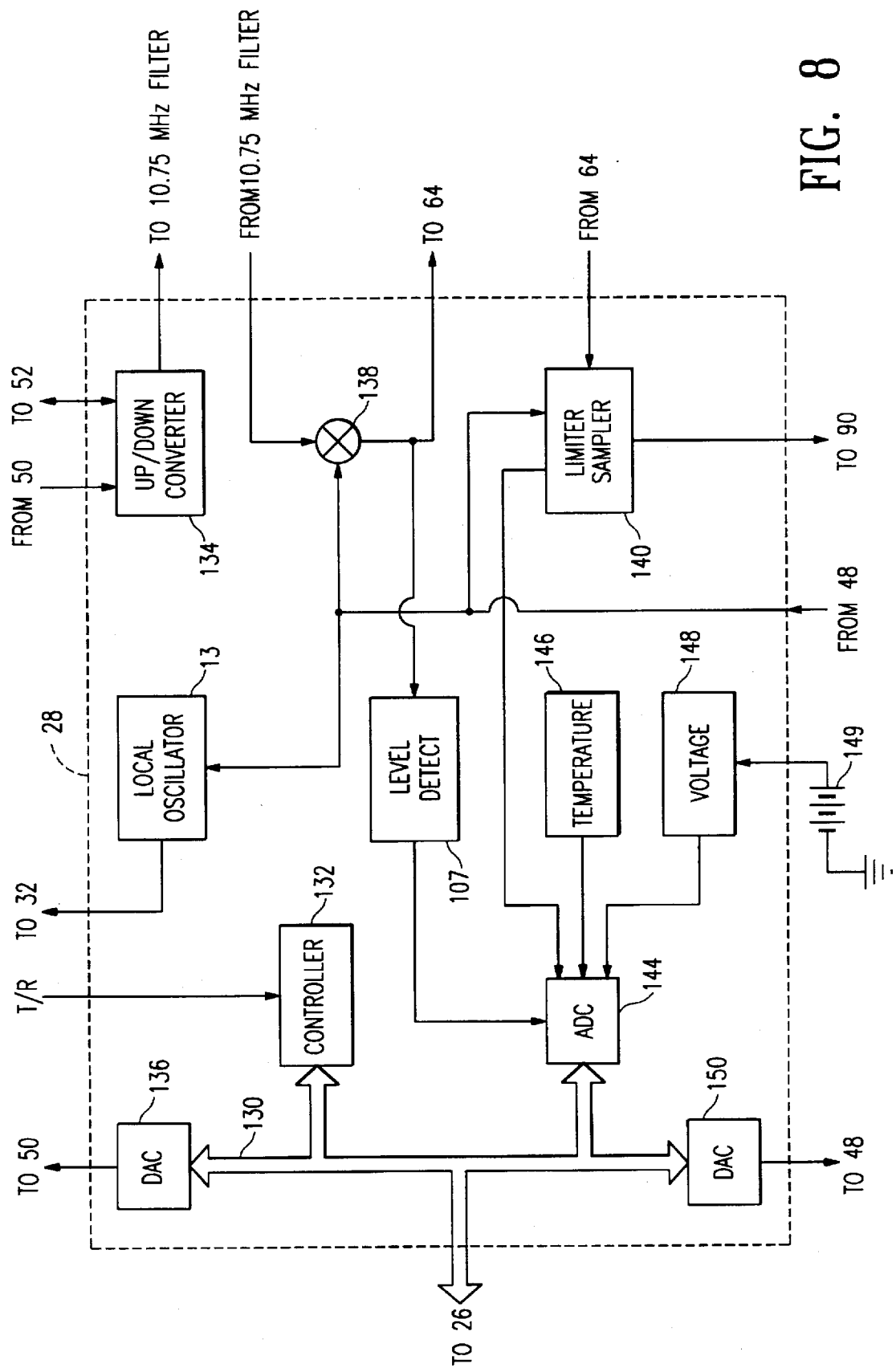
FIG. 8 is a more detailed schematic of the IF block depicted in FIG. 2.

Referring now to FIG. 8, a more detailed embodiment of IF chip 28 is depicted. Chip 28 is shown to include a data bus 130. It is noted that data bus 130 is shared for both transmitting information during a transmit operation and for providing environmental data to base band processor 26. Consider first the operation of processor 28 during a transmit operation.

The transmit/receive (T/R) signal is provided to controller 132. Controller 132 operates, among other things, to switch the signal up/down converter 134 into the up conversion mode. In accordance with a transmission operation, a series of digital samples are provided by processor 26 to bus 130 whereupon such samples are converted by digital to analog converter 136 into an analog signal having a frequency of approximately 10.752 MHz, which signal is provided to filter 50. It will be recalled that should processor 26 decide to modify the level of the signal to be transmitted, processor 26 can modify the conversion, i.e., increase or decrease the amplitude of the analog output.

The signal passing from filter 50 is provided to up/down converter 134 which in the preferred embodiment can be a single or double balanced mixer. As previously described in relation to FIG. 5, a master oscillator signal is provided to a local oscillator 136 (previously oscillator 100) which provides the required frequency signal to converter 134. It will be recalled that the frequency of the signal generated by oscillator 136 is preferably 259.2 MHZ, i.e., an integer multiple (27) of 9.6 MHz. The output of up/down converter during the transmit mode is provided to filter 52.

During a receive mode of operation, the output of filter 52 is provided to up/down converter 134 whereupon the signal is converted down to a frequency of approximately 10.75 MHz. Although this signal can be passed through filter 50, it is preferable to pass this signal through a separate 10.75 MHz band pass filter. The output of the separate band pass filter is provided to mixer 138. Mixer 138 mixes the receive signal with the 9.6 MHz signal received from synthesizer 48. The output Of mixer 138 is a signal having a frequency of approximately 1.15 MHz which is provided to band pass filter 64. The output of mixer 138 is also provided to level detector 107, which detects the level of the received signal. Detector 107 generates an indication signal which is converted to digital form and applied to shared bus 130.

The output of filter 64 is provided to limiter—sampler 140. As was indicated previously, the limiter—sampler 140 (previously 108) generates a signal representative of the analog signal received from filter 64 from which signal strength can be determined. The signal generated by limiter—sampler 140 is provided to converter 144 for conversion into digital form and applied to bus 130 for provision to the received signal strength indicator (RSSI) 89 in processor 26.

One of the advantages of implementing the IF processor in a single integrated chip is that the limiter and sample devices can be placed physically close together. In other words, the physical distance from the limiter to the sampler is extremely short.

Temperature and voltage sensing devices 146 and 148, respectively, provide signals which are indicative of the operating environment of processor 28. In particular, the temperature device provides an indication of the temperature of the chip. Voltage sensor 148 monitors the output voltage of battery 149. It will be recalled that ICs 26, 28, 30 and 32 are implemented in portable station 24 in connection with battery power. Battery 149 provides such power. As the voltage output of battery 149 rises and falls (assuming a rechargeable battery is utilized), various transmit and receive signal levels will be effected. Consequently, the battery voltage is monitored. The output of devices 146 and 148 are also provided to converter 144 which in turn provides a digital signal representative of the temperature and voltage on shared data bus 130. The temperature and voltage information are utilized by processor 26 in order to regulate the frequency being generated by master oscillator 48. To this end, processor 26 generates a control signal in support portion 88 (FIG. 4) which is provided to shared data bus 130. This control signal is converted by digital to analog controller 150 and provided to master oscillator 48.

Processor 26 also uses the temperature and voltage information to adjust the level of the signal being transmitted. In this regard, one embodiment of processor 26 can include a look-up table of temperature and voltage values with corresponding gain modification information. No special method for generating such a table is necessary. It has been found that the generation of this table can be accomplished empirically. In the preferred embodiment, the values which would be stored in such a table are analyzed and an equation is developed, using known curve fitting techniques, from which gain modification information can be determined dynamically.

Figure 9:
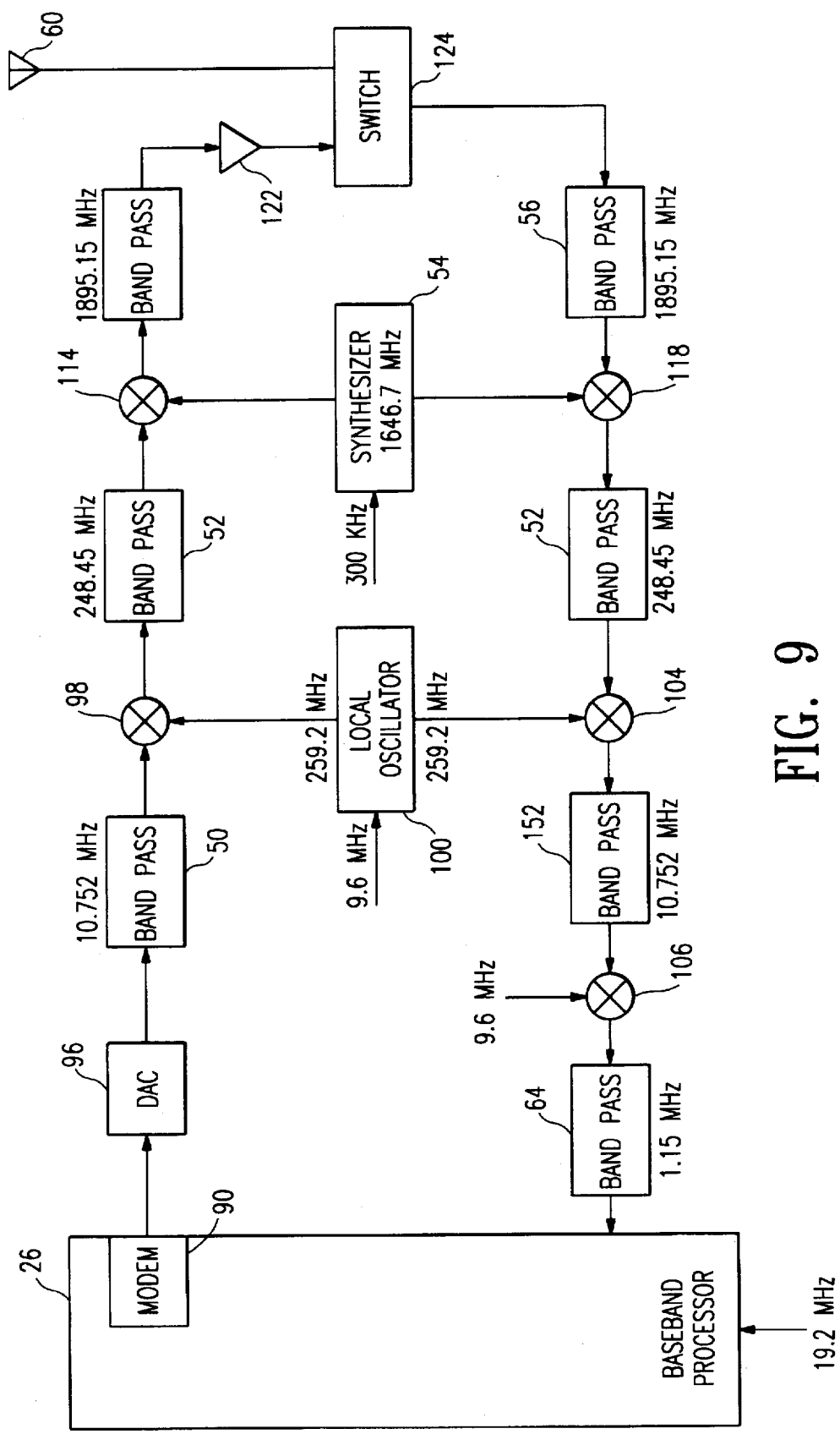
FIG. 9 is a diagrammatic view of a preferred embodiment of the intermediate frequency processor depicted in FIG. 2.

In order to get a more complete appreciation of the frequency translation scheme and the overall operation of the present invention, reference is now made to FIG. 9. It will be appreciated from FIG. 9, that all of the frequencies generated by local oscillator 100 and the frequencies of the signals provided to mixer 106 and base band processor 26, are all integer multiples of 9.6 MHz.

It has been discovered that an extra transmission channel can be obtained in the frequency range between 1,895 MHz to 1,918 MHz if the ultimate carrier frequency of signals transmitted from antenna 60 and received by antenna 60 are selected in accordance with the following formula:

$$F_0 = N \times 300 \text{ KHz} + 50 \text{ KHz}$$

where N is an integer such that N=6,317 for the base frequency of 1,895.15 MHz.

According to such a scheme, the operational frequencies or carrier frequencies do not fall on integral multiples of 300 KHz but rather, are integral multiples of 50 kHz. The switching speed of a single loop indirect frequency synthesizer (synthesizer 54) is proportional to the cycle time of the reference frequency. The reference frequency equals the frequency steps of the synthesizer. If one assumes that the synthesizer must settle in the 625 microsecond slot time, the synthesizer would need to settle within 31 cycles of the reference frequency if 50 kHz were used. For a 300 kHz reference frequency, the corresponding settling time is 187 cycles. It is extremely difficult to achieve the required phase noise and spurious performance within the 31 cycle period but it is feasible within 187 cycles. Accordingly, it is preferred for synthesizer 54 to have a reference frequency equal to 300 kHz. As the invention has been described, since approximately 10.752 MHz of frequency is generated by base band processor 26, synthesizer 54 can operate in steps of 300 kHz rather than 50 kHz.

Consider FIG. 9 in relation to a transmit operation. Base band processor 26 enables modulator 92 of modem 90 for a prescribed period of time. During that time period, the series of digital samples generated by modulator 92 (FIG. 4) are provided to digital analog converter 96. The output of converter 96 is an analog modulated signal having a frequency of approximately 10.752 MHz. Although the formula provided above indicates that a frequency offset of 50 kHz is desired, the provision of a 52 kHz offset is significantly easier to implement for the generation of digital samples. To this extent, it is preferred that the offset be a fraction of that frequency which the local oscillators are integer multiples, i.e., the offset frequency divided by the reference frequency (9.6 MHz in the preferred embodiment) should yield a fraction having an integer in the numerator and the denominator. In the embodiment shown in FIG. 9, 1.152 kHz is 3/25 of 9.6 MHz.

The analog signal output by converter 96 is passed through band pass filter 50 to mixer 98. Mixer 98 mixes the 10.752 MHz signal with a 259.2 MHz reference signal. The output of mixer 98 is a signal having a frequency of 248.45 MHz which is passed through band pass filter 52. The output of filter 52 is provided to mixer 114 where the signal is mixed with the output of synthesizer 54. As previously described, the output of synthesizer 54 can be modified in multiples of 300 kHz. The output of mixer 114 is passed through amplifier 122 and through switch 124 to antenna 60.

During the receive operation, the signal received by antenna 60 is passed through switch 124 to band pass filter 56. The output of filter 56 is provided to mixer 118. The signal generated by synthesizer 54 is heterodyned with the receive signal of mixer 118 to select the desired carrier signal. The desired carrier signal is passed through band pass filter 52 and mixed in mixer 104 with the 259.2 MHz signal provided by local oscillator 100. The output of mixer 104 is a signal having a frequency of approximately 10.75 MHz. This signal is passed through band pass filter 152 and provided to mixer 106. The output of mixer 106 is a 1.15 MHz signal which as described previously is passed through a limiter/interpolator before being provided to base band processor 26.

While the invention has been described and illustrated with reference to specific embodiments, those skilled in the art will recognize that modifications and variations may be made without departing from the principles of the invention as described hereinabove and set forth in the following claims.

What is claimed is:

1. An integrated circuit chip set for use in a cordless telephone system, wherein a voice signal is provided and a transmitted signal is received via an antenna, said chip set comprising:

a base integrated circuit chip, adapted to receive said voice signal, for converting said voice signal into a digital voice signal, and generating a modulated digital signal from the digital voice signal, the modulated digital signal having a first intermediate frequency;

an intermediate frequency integrated circuit chip, adapted for connection to said base chip, for converting said modulated digital signal having the first intermediate frequency into an analog signal having the first intermediate frequency and for modifying the frequency of said analog signal, wherein during transmission the frequency of said analog signal is up converted to a second intermediate frequency and wherein during reception said transmitted signal is down converted from the second intermediate frequency to the first intermediate frequency;

a radio frequency integrated circuit chip, adapted for connection to said intermediate frequency chip, for up converting during transmission the frequency of said analog signal from said second intermediate frequency to a desired radio frequency and for down converting during reception said transmitted signal from a desired radio frequency to said second intermediate frequency; and an amplifier integrated circuit chip, adapted for connection between said radio frequency chip and said antenna, said amplifier chip comprising transmission and receive paths, for amplifying said radio frequency signal during transmission and for switching said antenna between said transmit and receive paths.

2. A digital cordless telephone system, wherein a voice signal is provided and a transmitted signal is received via an antenna, said system comprising:

a base integrated circuit chip, connected to receive said voice signal, for converting said voice signal into a digital voice signal, and generating a modulated digital signal from the digital voice signal, the modulated digital signal having a first intermediate frequency;

an intermediate frequency integrated circuit chip, adapted for connection to said base chip, for converting said modulated digital signal having the first intermediate frequency into an analog signal having the first intermediate frequency and for modifying the frequency of said analog signal, wherein during transmission the frequency of said analog signal is up converted to a second intermediate frequency and wherein during reception said transmitted signal is down converted from the second intermediate frequency to the first intermediate frequency;

a radio frequency integrated circuit chip, connected to said intermediate frequency chip, for up converting during transmission the frequency of said analog signal from said second intermediate frequency to a desired radio frequency and for down converting during reception said transmitted signal from a desired radio frequency to said second intermediate frequency; and an amplifier integrated circuit chip, connected between said radio frequency chip and said antenna, said amplifier chip comprising transmission and receive paths, for amplifying said radio frequency signal during transmission and for switching said antenna between said transmit and receive paths.

3. The system of claim 2, further comprising a frequency synthesizer integrated circuit chip, connected to said radio frequency chip, for generating a reference signal for mixing with said radio frequency signal and said second intermediate frequency signal in said radio frequency chip.

4. The system of claim 2, wherein said base chip comprises a digital signal generator for generating a pulse code modulated signal respresentative of said voice signal.

5. The system of claim 4, wherein said base chip further comprises a modulator for generating a phase shift keyed modulated signal representative of said pulse code modulated signal.

6. A baseband integrated circuit chip for use in a cordless telephone system having a carrier frequency equal to a number times the bandwidth of each transmission channel plus an offset, wherein a voice signal is provided and a transmmitted signal having an intermediate frequency including the offset is received, said baseband chip comprising:

means for adaptively convening said voice signal into a digital voice signal representative of said voice signal;

a modem for generating a modulated digital signal in response to a control signal, said modem comprising:
a modulator for generating the modulated digital signal from the digital voice signal, the modulated digital signal having the intermediate frequency including the offset; and
a demodulator for receiving the transmitted signal having the intermediate frequency and generating a digital voice signal; and a control processor for generating said control signal so that said modem generates said digital signal only during desired time periods.

7. The baseband chip of claim 6, wherein said modulator comprises a signal generator for generating said digital signal representative of said voice signal at a repetition rate and an interpolator for generating digital samples at a sample rate, said digital samples being representative of a carrier signal having a carrier frequency.

8. The baseband chip of claim 7, wherein said modulator generates said digital samples so that said carrier frequency would be approximately 10.752 Mhz.

9. An intermediate frequency integrated circuit chip for use in a cordless telephone system having a controller, wherein a digital signal representative of a voice signal is provided by said controller and a transmitted signal is received, said intermediate frequency chip comprising:

a digital to analog converter for converting said digital signal to an analog signal for transmission;

an analog to digital converter for converting analog signals to be processed by said controller;

a data bus, connected between said converters and adapted for connection to said controller;

a mixer, connected to said digital to analog converter, said mixer adapted to effectively increase the frequency of said analog signal or to decrease the frequency of said transmitted signal; said mixer connected to either transmit said analog signal or to receive said transmitted signal; and a local oscillator, connected to said mixer, for providing a reference signal having a known frequency to said mixer, wherein said reference signal is used to both increase and decrease frequency;

wherein said data bus, said mixer and said local oscillator are shared for both receive and transmit operations.

10. The intermediate frequency chip of claim 9, wherein said mixer comprises:

a switch for switching between transmit and reception functions in response to a control signal, wherein said control signal is provided by said controller;

a first mixer for increasing the frequency of said analog signal; and a second mixer for decreasing the frequency of said transmitted signal.

11. The intermediate frequency chip of claim 9, further comprising a third mixer for further modifying the frequency of said transmitted signal after said signal is processed in said mixer.

12. The intermediate frequency chip of claim 11, further comprising a detector for detecting the data contained in said transmitted signal and for generating a digital receive signal representative of said data, said detector adapted for connection to said controller whereby said digital receive signal can be provided to said controller.

13. The intermediate frequency chip of claim 12, wherein said detector comprises a limiter and a sampler, wherein said limiter and said sampler are formed on said chip relatively close to one another.

14. A radio frequency integrated circuit chip for use in a cordless telephone system having a controller, wherein a reference signal having a known frequency is provided and wherein an analog signal representative of a voice signal is provided and a transmitted signal is received, said radio frequency chip comprising:

a first switch, adapted to be connected to receive said analog signal, said first switch being operable in response to a control signal provided by said controller;

a second switch, adapted to be connected to receive said transmitted signal, said second switch being operable in response to a control signal provided by said controller;

a first mixer, connected to receive said reference signal and between said first and second switches, thereby defining a transmit path; and a second mixer, connected to receive said reference signal and between said first and second switches, thereby defining a receive path.

15. An amplifier and switch integrated circuit chip for use in a cordless telephone system having a controller and an antenna, wherein an analog signal representative of a voice signal is provided for transmission by said antenna and a transmitted signal is received by said antenna, said amplifier and switch chip comprising:

a first switch, adapted to be connected to receive said analog signal, said first switch being operable in response to a control signal provided by said controller;

a second switch, adapted to be connected to receive said transmitted signal from said antenna, said second switch being operable in response to a control signal provided by said controller, said second switch being electronically connected to said first switch, thereby defining a receive path; and an amplifier, adapted to be connected between said first and second switches, thereby defining a transmission path, wherein said antenna is connected to either said transmission path or said receive path in response to said control signal.

16. Apparatus for cordless telephone operation, wherein voice signals are transmitted from said apparatus and remotely transmitted signals are received at an antenna associated with said apparatus, said apparatus comprising:

a first stage, adapted to receive a voice signal, for converting said voice signal to a digital signal having a repetition rate, for interpolating said digital signal to generate a series of digital samples at a sample rate, said digital samples being representative of a modulated carrier signal at a desired frequency and adapted to receive a digital signal representative of said transmitted signal;

a second stage, connected to said first stage, for receiving said series of digital samples, for converting said digital samples into an analog transmission signal having an initial frequency and for modifying said initial frequency in relation to a first reference signal having a first frequency and said second stage adapted to receive remotely transmitted signals having an intermediate frequency and for modifying the intermediate frequency of said transmitted signal in relation to a second reference signal having a second frequency, said first and second reference signals being locally generated; and a third stage, connected to said second stage and adapted to receive said remotely transmitted signals from said antenna, for further modifying the frequency of said transmission signal in relation to a first carrier signal having a third frequency and adapted to receive said remotely transmitted signals having a radio frequency from said antenna and for modifying the frequency of said remotely transmitted signal in relation to a second carrier signal having a fourth frequency;

wherein said sample rate, first and second frequencies are integer multiples of a master frequency.

17. The apparatus of claim 16, wherein said master frequency is 9.6 MHz.

18. The apparatus of claim 16, further comprising a master oscillator, connected to said first and second stages, for generating a master reference signal having said master frequency.

19. The apparatus of claim 16, wherein said modulated carrier signal has a modulated carrier frequency and wherein said modulated carrier frequency and said second frequency are equal.

20. The apparatus of claim 16, wherein said repetition rate is controlled by said first stage, wherein the ratio of said repetition rate to said master frequency is a fraction of two integers.

21. The apparatus of claim 20, wherein said ratio equals 3/25.

22. The apparatus of claim 16, wherein said third and fourth frequencies are equal.

23. The apparatus of claim 16, wherein said first stage comprises:

a modem for transmitting digital samples in response to a control signal, wherein said digital samples are only provided during desired periods, said modem comprising a modulator for generating said digital signal representative of said voice signal at said repetition rate and for interpolating said digital signal thereby generating digital samples at said sampling rate, said digital samples being representative of a carrier signal having a carrier frequency; and a controller, connected to said modem, for generating said control signal.

24. The apparatus of claim 16, further comprising a first bandpass filter connected between said second and third stage, said first bandpass filter defining a first band of frequencies, wherein said third frequency falls outside said band, such that if said analog transmission signal having said initial frequency is not present in said second stage, said first frequency will not pass through said first bandpass filter.

25. The apparatus of claim 24, further comprising a second bandpass filter connected between said third stage and said antenna, said second bandpass filter defining a second band of frequencies, wherein said first frequency falls outside said band, such that if said analog transmission signal having said initial frequency is not present in said second stage, said third frequency will not pass through said second bandpass filter.

26. The apparatus of claim 16, further comprising a synthesizer, connected to said third stage, for generating said first and second carrier signals.

27. The apparatus of claim 26, wherein said first and second carrier signals are integer multiples of a reference frequency.

28. The apparatus of claim 27, wherein said reference frequency is 300 kHz.

29. The apparatus of claim 27, wherein signals are received by and transmitted from said apparatus in defined channels, wherein said channels are spaced in time and wherein said reference frequency is selected in response to the channel spacing.

30. The apparatus of claim 16, wherein said first and second frequencies are equal.

31. A method for frequency translation in a cordless telephone, wherein voice signals are to be transmitted from and remotely transmitted signals are received at an antenna, said method comprising the steps of:

converting said voice signal to a digital signal having a repetition rate;

interpolating said digital signal to generate a series of digital samples at a sample rate, said digital samples being representative of a modulated carrier signal;

converting said digital samples into an analog transmission signal having an initial frequency;

modifying said initial frequency in relation to a first reference signal having a first frequency;

further modifying the frequency of said transmission signal in relation to a first carrier signal having a second frequency, wherein said sample rate and said first frequency are integer multiples of a master frequency.

32. The method of claim 31, further comprising the steps of:

receiving said remotely transmitted signals having a radio frequency from said antenna;

modifying the frequency of said remotely transmitted signal in relation to a second carrier signal having a third frequency, wherein said remotely transmitted signal is modified to have an intermediate frequency;

further modifying the remotely transmitted signal having an intermediate frequency by modifying the intermediate frequency in relation to a second reference signal having a fourth frequency;

converting said remotely transmitted signal into a digital signal; and converting said digital signal into a voice signal.

33. A digital cordless telephone system, wherein a voice signal is provided for transmission and a received signal is acquired via an antenna, said system comprising:

a base stage, connected to receive said voice signal, for generating a modulated digital signal from the voice signal, the modulated digital signal having a desired first intermediate frequency;

an intermediate frequency stage, connected to said base stage, for converting the modulated digital signal into an analog transmission signal having the desired first intermediate frequency and for modifying the frequency of said transmission signal, wherein during transmission the frequency of said transmission signal is up converted to a second intermediate frequency and wherein during reception said received signal is down converted from said second intermediate frequency to the desired first intermediate frequency;

a radio frequency stage, connected to said intermediate frequency stage, for up converting during transmission the frequency of said transmission signal from said second intermediate frequency to a desired radio frequency and for down converting during reception said received signal from a desired radio frequency to said second intermediate frequency; and an amplifier stage, connected between said radio frequency stage and said antenna, said amplifier stage comprising transmission and receive paths, for amplifying said transmission signal during transmission and for switching said antenna between said transmit and receive paths.

34. The system of claim 33, further comprising a gain controller for controls the level of said transmission signal.

35. The system of claim 34, wherein said digital signal is representative of a series of values, wherein said controller controls the level of said transmission signal by modifying said values.

36. The system of claim 34, wherein said controller controls the level of said transmission signal by modifying the conversion of said digital signal to an analog signal so that an analog signal having a desired level results.

37. The system of claim 34, further comprising an integrated circuit in which said intermediate stage is implemented and a temperature sensor for sensing the temperature of said integrated circuit and for providing a temperature indication signal, said indication signal being provided to said gain controller, wherein the level of said transmission signal is controlled by said controller in response to said temperature indication signal.

38. The system of claim 37, wherein said controller comprises a memory and a processing portion, wherein an equation for determining adjustments to the gain in relation to specific temperatures sensed by said temperature sensor is stored in said memory.

39. The system of claim 34, further comprising a battery for powering at least one of said stages and a voltage sensor for sensing the voltage of said battery and for providing a voltage indication signal, said voltage indication signal being provided to said gain controller, wherein the level of said transmission signal is controlled by said controller in response to said voltage indication signal.

40. The system of claim 39, wherein said intermediate stage comprises said voltage sensor.

41. The system of claim 39, wherein said controller comprises a memory and a processing portion, wherein an equation for determining adjustments to the gain in relation to specific voltages sensed by said voltage sensor is stored in said memory.

42. The system of claim 33, further comprising a level controller for controlling the level of said received signal.

43. The system of claim 42, wherein said level controller comprises a level network, connected in said receive path so that said received signal is passed through said level network, for modifying the level of said received signal.

44. The system of claim 43, wherein said level network comprises an amplifier, a first attenuator and a second attenuator, wherein said received signal is passed through either said amplifier or said first or second attenuators in response to a control signal.

45. The system of claim 44, wherein said amplifier increases the level of said received signal by approximately 13 dB, said first attenuator attenuates the level of said received signal by approximately −4 dB and said second attenuator attenuates the level of said received signal by approximately −28 dB.

46. The system of claim 43, wherein said level controller further comprises a level detector in said amplifier stage for detecting the level of said received signal from said antenna and for generating a level indicating signal representative of the detected level of said received signal, wherein said level controller generates said control signal in response to said level indicating signal.

47. The system of claim 43, wherein said level controller further comprises a level detector in said radio frequency stage for detecting the level of said received signal and for generating a level indicating signal representative of the detected level of said received signal, wherein said level controller generates said control signal in response to said level indicating signal.

48. The system of claim 43, wherein said level controller further comprises a level detector in said intermediate frequency stage for detecting the level of said received signal and for generating a level indicating signal representative of the detected level of said received signal, wherein said level controller generates said control signal in response to said level indicating signal.

49. The system of claim 48, wherein a portion of said level controller is implemented in said base stage, said portion being connected to receive said level indicating signal and connected to said level network, said portion for generating said control signal.

* * * * *